United States Patent
Ippolito et al.

(10) Patent No.: US 11,817,838 B2
(45) Date of Patent: Nov. 14, 2023

(54) AMPLIFICATION INTERFACE, AND CORRESPONDING MEASUREMENT SYSTEM AND METHOD FOR OPERATING AN AMPLIFICATION INTERFACE

(71) Applicant: STMicroelectronics S.r.l., Agrate Brianza (IT)

(72) Inventors: Calogero Marco Ippolito, Aci Castello (IT); Michele Vaiana, San Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/687,079

(22) Filed: Mar. 4, 2022

(65) Prior Publication Data
US 2022/0302890 A1    Sep. 22, 2022

(30) Foreign Application Priority Data
Mar. 15, 2021 (IT) .................. 102021000006098

(51) Int. Cl.
*H03F 3/45* (2006.01)

(52) U.S. Cl.
CPC ... *H03F 3/45753* (2013.01); *H03F 2200/228* (2013.01); *H03F 2200/331* (2013.01);
(Continued)

(58) Field of Classification Search
CPC ........... H03F 3/45753; H03F 2200/228; H03F 2200/331; H03F 2200/447;
(Continued)

(56) References Cited

U.S. PATENT DOCUMENTS

| 10,790,791 B2 * | 9/2020 | Hegde ................. H03F 3/45188 |
| 11,095,261 B2 | 8/2021 | Ippolito et al. |

(Continued)

FOREIGN PATENT DOCUMENTS

WO    2016032598 A2    3/2016

OTHER PUBLICATIONS

IT Search Report and Written Opinion for priority application, IT 102021000006098, report dated Nov. 17, 2021, 11 pages.
Kwan, Hing-Kit, et al: "Design of Hybrid Continuous-Time Discrete-Time Delta-Sigma Modulators," 2008, IEEE, pp. 1224-1227.
"A 5,sup>th—order CT/DT Multi-Mode [Delta][Sigma] Modulator", 2007 IEEE International Solid-State Circuits Conference (IEEE Cat. N0.07CH37858), IEEE, Piscataway, NJ, USA, Feb. 11, 2007 (Feb. 11, 2007), pp. 244-245, XP031606537.
(Continued)

*Primary Examiner* — Khanh V Nguyen
(74) *Attorney, Agent, or Firm* — CROWE & DUNLEVY

(57) ABSTRACT

An electronic amplification-interface circuit includes a differential-current reading circuit having a first input terminal and a second input terminal. The differential-current reading circuit includes a continuous-time sigma-delta conversion circuit formed by an integrator-and-adder module generating an output signal that is coupled to an input of a multilevel-quantizer circuit configured to output a multilevel quantized signal. The integrator-and-adder module includes a differential current-integrator circuit configured to output a voltage proportional to an integral of a difference between currents received at the first and second input terminals. A digital-to-analog converter, driven by a respective reference current, receives and converts the multilevel quantized signal into a differential analog feedback signal. The integrator-and-adder module adds the differential analog feedback signal to the differential signal formed at the first and second input terminals.

19 Claims, 5 Drawing Sheets

(52) U.S. Cl.
CPC .. *H03F 2200/447* (2013.01); *H03F 2200/471* (2013.01); *H03F 2203/45441* (2013.01); *H03F 2203/45514* (2013.01)

(58) Field of Classification Search
CPC ..... H03F 2200/471; H03F 2203/45441; H03F 2203/45514; H03F 3/45183; H03F 3/45475; H03F 3/4565; H03F 3/45179; H03F 3/45192; H03F 3/45089; H03F 3/08; H03F 3/087; H03F 3/082; H03F 3/085; G01R 19/2506; H03M 3/424; H03M 3/458; H03M 3/494
USPC .................................................. 330/253, 308
See application file for complete search history.

(56) References Cited

U.S. PATENT DOCUMENTS

| | | |
|---|---|---|
| 2006/0244067 A1 | 11/2006 | Socher et al. |
| 2011/0315880 A1 | 12/2011 | Nemirovsky |
| 2017/0205366 A1 | 7/2017 | Nemirovsky |
| 2020/0259474 A1 | 8/2020 | Ippolito et al. |
| 2022/0247372 A1* | 8/2022 | Xu ..................... H03F 3/45946 |

OTHER PUBLICATIONS

"A 106-dB SNR hybrid oversampling anag-to-digital converter for digital audio", IEEE Journal of Solid-State Circuits, v01. 40, No. 12, Dec. 1, 2005 (Dec. 1, 2005), pp. 2408-2415, XP055193334.

* cited by examiner

AMPLIFICATION INTERFACE, AND CORRESPONDING MEASUREMENT SYSTEM AND METHOD FOR OPERATING AN AMPLIFICATION INTERFACE

PRIORITY CLAIM

This application claims the priority benefit of Italian Application for Patent No. 102021000006098, filed on Mar. 15, 2021, the content of which is hereby incorporated by reference in its entirety to the maximum extent allowable by law.

TECHNICAL FIELD

The embodiments of the present disclosure relate to measurement systems.

BACKGROUND

FIG. 1 shows a typical measurement system. In general, the measurement system comprises a sensor 10 and a processing circuit 40.

In particular, the sensor 10 is configured to supply a measurement signal MS representing a quantity to be measured. For instance, the sensor 10 may be an environmental sensor, such as a temperature sensor, brightness sensor, etc. Instead, the processing circuit (Proc) 40 is configured to process the measurement signal MS.

Typically, the measurement signal MS is not supplied directly to the processing circuit 40, but an amplification circuit (Amp) 20 is used configured to generate an amplified measurement signal AS. In general, the amplification circuit 20 can carry out various operations. For instance, with sensors that produce at output a current signal, the amplification circuit 20 can supply at output a voltage signal. Moreover, the amplification circuit 20 can be configured to amplify only the variation of the measurement signal MS in such a way as to cover, preferably with its maximum swing, the input dynamics of the circuit downstream.

For instance, frequently the processing circuit 40 is a digital circuit, such as a microprocessor programmed via software code. In this case, the processing circuit 40 has associated to it an analog-to-digital (A/D) converter 30 configured to receive at input the amplified signal AS and to supply at output a digital signal DS that comprises digital samples of the amplified signal AS.

For instance, the sensor 10 may comprise one or more TMOS transistors. Specifically, by the term "TMOS" is meant a particular metal-oxide semiconductor (MOS) device. In particular, this device comprises a MOS transistor thermally isolated with respect to the substrate of the integrated circuit. Typically, the TMOS transistor is provided in a "suspended" configuration in order to maximize thermal insulation from the remaining portion of the die in which it is obtained. Such a TMOS device is hence frequently referred to as "thermally isolated MOS" (owing to the thermal isolation of the MOS) or simply as "thermal MOS" (owing to its capacity for detecting temperature variations).

For example, sensors of this type are described in United States Patent Application Publication Nos. 2006/0244067, 2011/0315880, and 2017/0205366, which are incorporated herein by reference. For instance, such a suspended MOS transistor may be manufactured using an appropriate process of micro-machining and dry etching with a traditional CMOS-SOI or SOI-CMOS (Silicon-On-Insulator Complementary-Metal-Oxide Semiconductor) process.

The TMOS transistor is an element useful for developing new-generation sensing devices, such as infrared (IR) temperature sensors, anti-intrusion sensors, gas-flow sensors, etc. Use of the TMOS transistor as active sensitive element presents advantages in terms of internal gain, multiplexing within the sensor, and high temperature sensitivity. Since the TMOS can be used in sub-threshold conditions, with a very low power consumption, it can be supplied by a battery, enabling a wide range of applications in the sectors of mobile phones, smart home, IoT (Internet of Things), and safety and security.

As described in United States Patent Application Publication No. 2017/0205366, TMOS sensors must be appropriately biased, and then the small signal produced by the sensor (due to the variation of temperature to which the TMOS is subjected) is to be amplified and post-processed. Hence, the design of a reading circuit architecture is fundamental for detecting appropriately the signal produced by a TMOS sensor.

United States Patent Application Publication No. 2020/0259474 describes a solution of this type, in which the signal current is sent at input to a pre-amplification block regulated by signals synchronous to the clock signal and which envisages use of sample steps, in particular hold steps, on the preamplified voltage, which is then converted from analog to digital, thus operating according to a discrete-time mode. Constraints on the frequency of these signals synchronous to the clock signal render the circuit disadvantageous in terms of power consumption, so that the architecture described in this document may be limiting, in the case where it is necessary to reduce as much as possible power consumption. In addition, this architecture renders necessary a driving stage (or pre-amplification stage) for insulating the continuous-time signal to be read from the input stage of a switched-capacitor type of the analog-to-digital converter.

Considering the foregoing, there is a need in the art to provide solutions that are able to overcome one or more of the limits of the prior art.

SUMMARY

One or more embodiments concern an amplification interface. The embodiments moreover concern a corresponding measurement system and a method for operating an amplification interface.

As mentioned previously, various embodiments of the present disclosure regard an electronic amplification-interface circuit of a sensor circuit, said sensor circuit comprising: a first FET and a second FET arranged in a differential pair that supplies a differential current to a respective first node and a respective second node; and a differential-current reading circuit, comprising a first input terminal connected to said second node and a second input terminal connected to said first node, said differential-current reading circuit comprising at least one continuous-time sigma-delta conversion circuit, which includes at least one integrator-and-adder module, the output signal of which is coupled to the input of a multilevel-quantizer circuit, which supplies at output a multilevel quantized signal.

The first integrator-and-adder module comprises: a differential current-integrator circuit configured to supply at output through two output terminals a voltage proportional to the integral of a difference between the current received at said second input terminal of said differential integrator circuit and the current received at said first input terminal of said differential current integrator, and a digital-to-analog converter, driven by a respective reference current, which receives said multilevel quantized signal and converts it into a differential analog feedback signal, said integrator-and-adder module being configured to add said differential analog feedback signal to said differential signal formed at said first and second input terminals of said integrator circuit.

In various embodiments, said sensor comprises: a first FET and a second FET; a first node, a second node, and a third node, in which a drain terminal of said first FET is connected to said first node, a drain terminal of said second FET is connected to said second node, and the source terminals of said first and second FETs are connected to said third node; a first bias-current generator configured to generate a bias current at an output of said first bias-current generator, wherein the output of said first bias-current generator is connected to said first node; a second bias-current generator configured to generate a bias current at an output of said second bias-current generator, where the output of said second bias-current generator is connected to said second node; and a third FET, where a drain terminal of said third FET is connected to said third node and a source terminal of said third FET is connected to a reference voltage.

In various embodiments, the circuit comprises at least one current generator configured to apply a correction current to said first node and/or to said second node.

In various embodiments, the circuit comprises a regulation circuit configured to drive a gate terminal of said third FET in such a way as to regulate the common mode of the voltage at said first node and of the voltage at said second node on a required value.

In various embodiments, said regulation circuit is configured to drive said gate terminal of said third FET in such a way that:

$(V_{O1P}+V_{O1N})/2=V_{CM1}$ where $V_{O1P}$ corresponds to the voltage at said first node, $V_{O1N}$ corresponds to the voltage at said second node, and Von corresponds to said required value.

In various embodiments, said differential current-integrator circuit comprises a differential operational amplifier, wherein: a first input terminal of said differential operational amplifier is connected to said second node; a second input terminal of said differential operational amplifier is connected to said first node; a first capacitor is connected between a first output terminal of said differential operational amplifier and the first input terminal of said differential operational amplifier; and a second capacitor is connected between a second output terminal of said differential operational amplifier and the second input terminal of said differential operational amplifier.

In various embodiments, said converter comprises a plurality of said integrator-and-adder modules set in series, the respective converters of which receive said multilevel quantized signal, the output of the last integrator-and-adder module in said series being coupled to the input of said multilevel quantizer.

In various embodiments, the circuit comprises, coupled between said module or plurality of modules and said multilevel quantizer, a sample circuit comprising a first electronic switch and a second electronic switch coupled on said inputs of said quantizer and driven by means of a sample signal at a given sample frequency.

In various embodiments, said converter comprises at least one discrete-time sigma-delta conversion circuit, which is coupled between said first module or plurality of modules and said multilevel quantizer and comprises a respective integrator circuit and a respective digital-to-analog converter, which receives said multilevel quantized signal and converts into an analog feedback signal, which is added to the signal at the differential input of the respective integrator circuit, and respective track-and-hold circuits, in particular switched-capacitor circuits, set between the output of said module or plurality of modules and said differential input and set between the output of the digital-to-analog converter and said differential input.

In various embodiments, the circuit comprises a decimator circuit coupled to the output of said multilevel quantizer.

In various embodiments, said first and second bias-current generators are current generators of a PTAT (Proportional-To-Absolute Temperature) type.

In various embodiments, said first and second FETs are MOS transistors, preferably n-channel transistors.

In various embodiments, said first and second FETs are TMOS transistors, wherein the gate terminals of said first and second FETs are connected to a further reference voltage.

In various embodiments, said reference current is generated by a current generator independent of temperature, in particular a generator of a bandgap type.

The solution described herein also refers to a measurement system comprising: an amplification interface according to the above; and a processing circuit connected to an output of said amplification interface.

The solution described herein also refers to a method for operating an amplification interface according to any one of the preceding embodiments, comprising: exposing said first and second FETs to two different temperatures; and monitoring the voltage at the two output terminals of said reading circuit.

BRIEF DESCRIPTION OF THE DRAWINGS

The embodiments of the present disclosure will now be described with reference to the annexed drawings, which are provided purely by way of non-limiting example, and in which.

DETAILED DESCRIPTION

In the ensuing description, various specific details are illustrated, aimed at providing an in-depth understanding of the embodiments. The embodiments may be provided without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present disclosure is intended to indicate that a particular configuration, structure, or characteristic described in relation to the embodiment is comprised in at least one embodiment. Hence, phrases such as "in an embodiment" or "in one embodiment" that may be present in various points of this description do not necessarily refer to one and the same embodiment. Moreover, particular conformations, structures, or characteristics may be combined in any adequate way in one or more embodiments.

The references used herein are provided only for convenience and hence do not define the sphere of protection or the scope of the embodiments.

Figure 1:
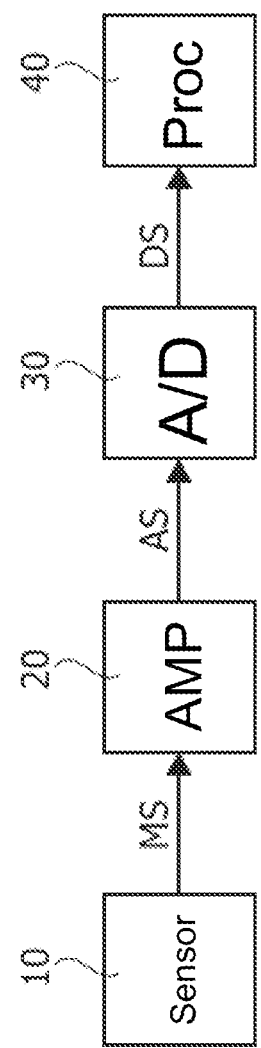
FIG. 1 shows a measurement system.

In FIGS. 2 to 5 described hereinafter, parts, elements or components that have already been described with reference to FIG. 1 are designated by the same references used previously in FIG. 1 itself; the description of these elements presented previously will not be repeated hereinafter in order not to overburden the present detailed description.

As explained previously, various embodiments of the present disclosure regard an electronic amplification interface devised for "reading" the signal produced by TMOS sensors.

Figure 2:
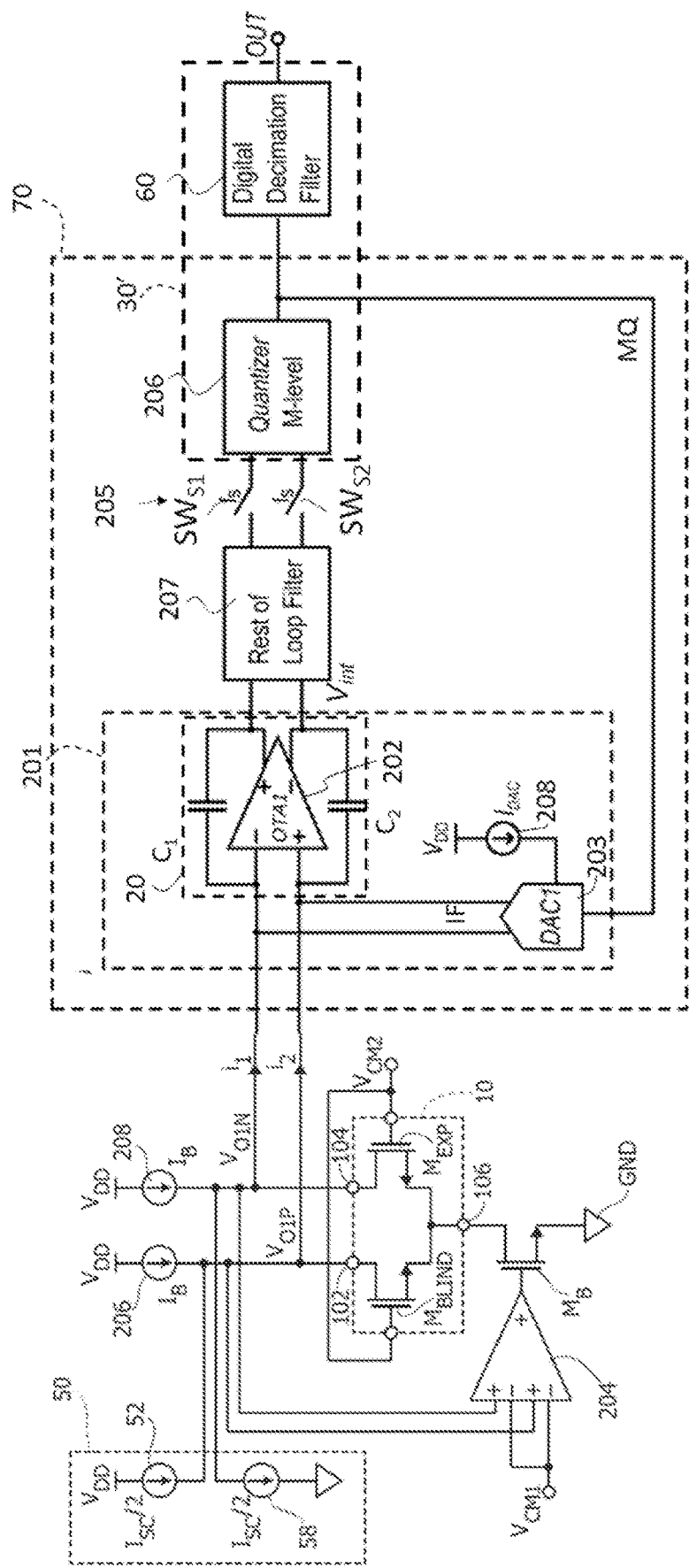
FIG. 2 is a schematic illustration of an amplification interface according to the solution described herein.

FIG. 2 a schematic illustration of a first embodiment of a measurement system comprising: a thermally isolated MOS (TMOS) sensor 10; an electronic amplification interface; and an optional analog-to-digital conversion module 30'.

In particular, in the embodiment the TMOS sensor 10 comprises two TMOS transistors $M_{BLIND}$ and $M_{EXP}$. In the embodiment considered, these transistors are field-effect transistors (FETs), for example n-channel FETs.

In various embodiments, these two TMOS transistors are provided within one and the same integrated circuit/die and have the same characteristics, in particular with reference to sizing of the transistors; i.e., the transistor $M_{BLIND}$ is substantially a copy of the transistor $M_{EXP}$. Preferably, the TMOS transistors $M_{BLIND}$ and $M_{EXP}$ are positioned close to one another.

The electronic amplification interface is configured to amplify the differential signal across the two transistors, for example the differential signal between the drain terminals of the transistors $M_{BLIND}$ and $M_{EXP}$. For instance, as will be described hereinafter, this enables rejection of the common-mode signals and disturbances that reach both of the transistors of the TMOS sensor itself.

The differential signal results from the fact that the TMOS transistor $M_{EXP}$ is "exposed", i.e., the TMOS transistor $M_{EXP}$ is configured to be exposed to the variation in temperature that the quantity that is to be measured produces thereon, whereas the other TMOS transistor $M_{BLIND}$ is "blind", i.e., the TMOS transistor $M_{BLIND}$ is configured in such a way that the physical quantity that is to be measured does not have any effect thereon.

For instance, the quantity that is to be measured is the infrared radiation produced by an object set at a distance from the TMOS sensor 10. As is well known, the infrared radiation is a function of the temperature of the object itself. Consequently, the measurement of the infrared radiation emitted by an object enables indirect measurement of the temperature of the object. In this case, the transistor $M_{BLIND}$ is hence shielded from the IR radiation, whereas the transistor $M_{EXP}$ is configured to receive the IR radiation produced by the object. Consequently, the power of the IR radiation received by the transistor $M_{EXP}$ will cause a slight heating of the transistor $M_{EXP}$ (and not of the transistor $M_{BLIND}$). This difference in temperature consequently generates a variation in the differential signal across the sensor 10 that the amplification interface should amplify. In fact, in general, a minor variation of temperature of the transistor $M_{EXP}$ causes a small shift within the I-V characteristic of the transistor $M_{EXP}$, which in turn generates a minor variation in the differential signal across the transistors $M_{BLIND}$ and $M_{EXP}$.

Consequently, in general, the variation in temperature of the transistor $M_{EXP}$ (and not of the transistor $M_{BLIND}$) that the physical quantity that is to be measured (IR radiation, gas flow, etc.) produces, results in a variation of the electrical characteristics of the transistor $M_{EXP}$ (and not of the transistor $M_{BLIND}$), which in turn results in a variation of the differential signal that the amplification interface should amplify. Instead, the amplification interface should be configured in such a way that the common-mode variations on the transistors $M_{EXP}$ and $M_{EXP}$ (for example, the variation of the ambient temperature, and in general all the common-mode disturbances) will not produce any variation in the differential signal, and hence their effect is filtered/compensated.

Even though the present disclosure has been devised and studied for amplifying as much as possible the signal generated by a TMOS sensor 10, the electronic amplification interface proposed is functional and suitable also in the case where, instead of the TMOS transistors, two conventional MOS transistors are used since the amplification interface is configured to amplify a differential signal across two transistors, such as a differential signal at the drain terminals of two n-channel transistors.

As explained previously, the electronic amplification interface should amplify the differential signal between the two transistors $M_{BLIND}$ and $M_{EXP}$. To generate such a differential signal there is thus required a circuit that generates an appropriate biasing of the transistors $M_{BLIND}$ and $M_{EXP}$.

For instance, in the embodiment considered, the electronic amplification interface comprises for this purpose two current generators 206 and 208. In particular, the current generator 206 is connected in series to the drain and source terminals of the transistor $M_{BLIND}$, and the current generator 208 is connected in series to the drain and source terminals of the transistor $M_{EXP}$.

For example, in the embodiment considered, the transistors $M_{BLIND}$ and $M_{EXP}$ are n-channel transistors. In this case, as also described in United States Patent Application Publication No. 2017/0205366, the current generator 206 may be connected (for example, directly) between the drain terminal of the transistor $M_{BLIND}$ and a reference voltage $V_{DD}$, which for example corresponds to the supply voltage of the integrated circuit and/or of the processing circuit 40 illustrated in FIG. 1. Likewise, the current generator 208 may be connected (for example, directly) between the drain terminal of the transistor $M_{EXP}$ and the reference voltage $V_{DD}$.

The gate terminal of the transistor $M_{BLIND}$ is connected (for example, directly) to the gate terminal of the transistor $M_{EXP}$, which in turn is connected (for example, directly) to a reference voltage $V_{CM2}$. In general, when instead of the TMOS transistors two normal transistors are used, the input signal can be applied between the gate terminals of the transistors $M_{BLIND}$ and $M_{EXP}$.

The circuit of FIG. 2 also comprises a common-mode control circuit. In particular, the source terminal of the transistor $M_{BLIND}$ is connected (for example, directly) to the source terminal of the transistor $M_{EXP}$, which in turn is connected (for example, directly) by means of a transistor $M_B$ to a reference voltage, for example ground GND. Considering that the TMOS transistors are n-channel transistors, preferably also the transistor $M_B$ is an n-channel transistor. The drain terminal of the transistor $M_B$ is then connected (for example, directly) to the source terminal of the transistor $M_{BLIND}$/to the source terminal of the transistor $M_{EXP}$, i.e., the terminal 106, and the source terminal of the transistor $M_B$ is connected (for example, directly) to the reference voltage, e.g. GND.

Consequently, the sensor 10 is connected to the amplification interface by means of three terminals: a terminal 102 that corresponds to the drain terminal of the transistor $M_{BLIND}$; a terminal 104 that corresponds to the drain terminal of the transistor $M_{EXP}$; and a terminal 106 that corresponds to the source terminals of the transistors $M_{BLIND}$ and $M_{EXP}$.

Each of the current generators 206 and 208 supplies a current $I_B$. For instance, the current generators 206 and 208 may be implemented with a current mirror. Consequently, in the circuit of FIG. 1, the bias current of the transistor $M_{EXP}$ and of the transistor $M_{BLIND}$ is substantially equal to $I_B$, whereas the current of the transistor $M_B$ is substantially equal to $2 \cdot I_B$.

This part of the circuit hence corresponds substantially to an operational transconductance amplifier, as described, for example, in U.S. Pat. No. 6,693,485 (incorporated by reference).

In the circuit of FIG. 2, the gate terminal of the transistor $M_B$ is driven by means of a control circuit 204. In particular, the control circuit 204 is configured to monitor the voltage $V_{O1P}$ at the drain terminal of the transistor $M_{BLIND}$ and the voltage $V_{O1N}$ at the drain terminal of the transistor $M_{EXP}$, as well as to generate the driving signal for the gate terminal of the transistor $M_B$ as a function of the above voltages. In particular, the control circuit 204 is configured to control (via feedback of the voltages $V_{O1P}$ and $V_{O1N}$) the voltage at the gate of the transistor $M_B$ in such a way that the common mode of the voltages $V_{O1P}$ and $V_{O1N}$ is equal to a reference voltage $V_{CM1}$; i.e., the control circuit 204 is configured to regulate the gate-to-source voltage $V_{GS}$ of the transistor $M_B$ in such a way that:

$$(V_{O1P}+V_{O1N})/2=V_{CM1}$$

The control circuit 204 can be implemented with a regulator, which comprises at least one component I (Integral) and possibly a component P (Proportional), by means of one or more operational amplifiers.

The amplification interface is configured in such a way that the transistors $M_{BLIND}$ and $M_{EXP}$ are biased to work in the sub-threshold region. For instance, once the bias current of the transistors $M_{EXP}$ and $M_{BLIND}$ is fixed equal to $I_B$, these transistors can be sized with a ratio (width/length W/L) sufficiently high to guarantee that the voltage between the gate and source terminals $V_{GS}$ is lower than the threshold voltage $V_T$ of the transistors, i.e., $V_{GS}<V_T$.

There here follows an analysis of the effect of the temperature T of the TMOS transistors on the differential signal. In particular, assuming that the transistors $M_{BLIND}$ and $M_{EXP}$ are biased in sub-threshold conditions, the current at the drain terminal $I_D$ may be modelled, for example, with the model described in the document by Clifton Fonstad, "MOSFETs in the Sub-threshold Region (i.e., a bit below $V_T$)", MIT, Oct. 28, 2009 (incorporated by reference), in particular Eq. (29):

$$I_D = \frac{W}{L} \cdot \mu_e \cdot C_{ox} \cdot (n-1) \cdot \phi_t^2 \cdot e^{\frac{V_{GS}-V_T}{n\phi_t}} \cdot \left(1-e^{-\frac{V_{DS}}{\phi_t}}\right) \quad (1)$$

For a definition of the parameters of Eq. (1), reference may be made to the document cited. In particular, the inventors have noted that the following parameters of the equation depend upon the temperature T of the transistor:

$\mu_e$, which is the mobility; and $V_T$, which is the threshold voltage of the transistor.

In various embodiments, the voltages $V_{CM1}$ and $V_{CM2}$ are chosen in such a way that the voltages between the drain and source terminals Vis of the transistors $M_{BLIND}$ and $M_{EXP}$ are large as compared to the thermal voltage $\phi_T$, for example $V_{DS} > 3\phi_T$. In this case, Eq. (1) simplified to:

$$I_D = \frac{W}{L} \cdot \mu_e \cdot C_{ox} \cdot (n-1) \cdot \phi_t^2 \cdot e^{\frac{V_{GS}-V_T}{n\phi_t}} \quad (2)$$

Moreover, substituting the thermal voltage $\phi_T$ with kT/q and assuming that the mobility $\mu_e$ of the transistors can be approximated with $$\mu_e(T) \cong \mu_{e0}\left(\frac{T_0}{T}\right)^2 \quad (3)$$

where $\mu_{e0}$ and $T_0$ are two constants, the current $I_D$ of the transistors can be written as $$I_{D,TMOS} = \mu_n(T)C_{ox}(n-1)V_t^2 \frac{W}{L} \cdot e^{\frac{(V_{GS}-V_{TH}(T))}{nV_t}} \cdot \left(1-e^{-\frac{V_{DS}}{V_t}}\right) \quad (4)$$

i.e., $$I_D = \frac{W}{L} \cdot \mu_{e0}\left(\frac{kT_0}{q}\right)^2 \cdot C_{ox} \cdot (n-1) \cdot e^{\frac{q}{nkT}(V_{GS}-V_T(T))} \quad (5)$$
$$= I_{D0} \cdot e^{\frac{q}{nkT}(V_{GS}-V_T(T))}$$

where $I_{D0}$ represents a constant.

In the ensuing treatment, the difference in temperature between the two TMOS transistors, which gives rise to the differential signal, will be denoted by:

$$\Delta T_{TMOS} = T_{M_{EXP}} - T_{M_{BLIND}}. \quad (6)$$

The variation of the current of the TMOS transistors caused by a minor variation in temperature of the transistor itself may hence be evaluated by differentiating Eq. (5) with respect to the temperature and then multiplying by the difference $\Delta T_{TMOS}$. Differentiating Eq. (5), we obtain:

$$\frac{d\,I_D}{dT} = I_{D0} \cdot e^{\frac{q}{nkT}(V_{GS}-V_T(T))} \cdot \frac{d}{dT}\left(\frac{q}{nkT}(V_{GS}-V_T(T))\right) \quad (7)$$
$$= I_D \cdot \frac{q}{nkT}\left[\frac{V_{GS}-V_T(T)}{T} - \frac{d\,V_T(T)}{dT}\right] = g_m(T) \cdot \alpha_{VGS}(T)$$

where the factor $$I_D \cdot \frac{q}{nkT}$$

is the small-signal transconductance of the TMOS transistors, which is denoted by $g_m$.

Considering that in the solution proposed $I_D \approx I_B$, we have:

$$g_m = \frac{dI_D}{dV_{GS}} = \frac{I_D}{n\frac{kT}{q}} \cong \frac{I_B}{n\Phi_T} \quad (8)$$

The multiplicative factor $$\alpha_{V_{GS}}(T) = \left[\frac{V_{GS} - V_T(T)}{T} - \frac{dV_T(T)}{dT}\right]$$

may be considered equal to $$\alpha_{V_{GS}}(T) = \frac{dV_{GS}}{dT} \quad (9)$$

since $$\alpha_{V_{GS}}(T)\frac{dI_D}{dV_{GS}} = \frac{dI_D}{dT}$$

i.e., $\alpha_{V_{GS}}(T)$ is the non-normalized temperature coefficient of the voltage $V_{GS}$ of the transistors.

The inventors have noted that, for typical values, the term $\alpha_{V_{GS}}(T)$ has little incidence in the variation in temperature. In fact, if $g_m(T)$ is rendered substantially independent of the temperature, likewise the term $g_m(T)\alpha_{V_{GS}}(T)$ will be to a good approximation independent of temperature.

In general, the current of the TMOS transistors can thus be written as the sum of a biasing value and a small-signal value:

$$I_{D,EXP} = I_B + i_{SIG\_EXP} \quad (10)$$

$$I_{D,BLIND} = I_B + i_{SIG\_BLIND} \quad (11)$$

where the small-signal contribution is due to a minor variation of temperature that there is on the TMOS transistors $M_{EXP}$ and $M_{BLIND}$, respectively:

$$i_{SIG\_EXP} \cong \frac{d\,I_D}{dT}\bigg|_{T_{amb}} \cdot \Delta T_{M_{EXP}} = \frac{I_B}{n\phi_t} \cdot \alpha_{V_{GS}}(T)\big(T_{M_{EXP}} - T_{amb}\big) \quad (12)$$

$$i_{SIG\_BLIND} \cong \frac{d\,I_D}{dT}\bigg|_{T_{amb}} \cdot \Delta T_{M_{BLIND}} = \frac{I_B}{n\phi_t} \cdot \alpha_{V_{GS}}(T)\big(T_{M_{BLIND}} - T_{amb}\big) \quad (13)$$

In the embodiment considered, the amplification circuit consequently does not amplify the difference of voltage between the drain terminals of the transistors $M_{BLIND}$ and $M_{EXP}$, but the circuit amplifies a current is that corresponds to the difference of the currents of Eqs. (12) and (13).

For this purpose, the drain terminal of the transistor $M_{BLIND}$ and the drain terminal of the transistor $M_{EXP}$ are connected to an amplification circuit 20 configured to operate as differential current integrator. In particular, the circuit 20 comprises two input terminals for receiving, respectively, a first current $i_1$ and a second current $i_2$. Moreover, the circuit 20 is configured to generate an output signal, such as a voltage Vint, which is proportional to the integral of the difference between the currents $i_2$ and $i_1$.

For instance, in the embodiment considered, the amplification circuit 20 is implemented via a single operational amplifier 202, such as an OTA (Operational Transconductance Amplifier). However, in general, the circuit 20 could also comprise a plurality of operational amplifiers.

In particular, a first input terminal of the operational amplifier 202 (typically the negative terminal) is connected (for example, directly) to the drain terminal of the transistor $M_{EXP}$, i.e., the terminal 104, and hence receives the current $i_1$. Instead, a second input terminal of the operational amplifier 202 (typically the positive terminal) is connected (for example, directly) to the drain terminal of the transistor $M_{BLIND}$, i.e., the terminal 102, and hence receives the current $i_2$. A first terminal of the differential output of the operational amplifier 202 (typically, the positive output terminal) is connected by means of a first feedback network to the first input terminal of the operational amplifier 202 and a second output terminal of the operational amplifier 202 (typically, the negative output terminal) is connected by means of a second feedback network to the first input terminal of the operational amplifier 202. In particular, the first and second feedback networks comprise, respectively, at least one integration capacitor. For instance, in the embodiment considered, a capacitor $C_1$ is connected (for example, directly) between the first output terminal and the first input terminal, and a capacitor $C_2$ is connected (for example, directly) between the second output terminal and the second input terminal.

Consequently, the current $i_1$ charges the capacitor $C_1$, the current $i_2$ charges the capacitor $C_2$, and the output voltage corresponds to the difference of the voltages across the capacitors $C_1$ and $C_2$. Hence, considering the inverting configuration illustrated in FIG. 2, the amplification circuit 20 is configured to amplify a current $i_S = i_2 - i_1$.

Consequently, considering also Eqs. (10) and (11), in various embodiments, the amplification circuit 20 receives at input a current $$i_S = i_{SIG\_EXP} - i_{SIG\_BLIND} \quad (14)$$

In various embodiments, the amplification interface may also comprise a current generator 50, which supplies an additional compensation current $i_{SC}$ at input to the integrator 20. For instance, in the embodiment considered, the current generator 50 comprises a first current generator 52, which supplies a current $I_{SC}/2$ to the first input terminal of the integration circuit 20, and a second current generator 58, which supplies a current $-I_{SC}/2$ to the second input terminal of the integration circuit 20.

Consequently, in various embodiments, the amplification circuit 20 receives at input a current:

$$i_S = i_{SIG\_EXP} - i_{SIG\_BLIND} + I_{SC} \quad (15)$$

Hence, considering also Eqs. (12) and (13), the current is corresponds to:

$$i_S = \frac{I_B}{n\varphi_T} \cdot \alpha_{V_{GS}}(T_{amb})\Delta T_{TMOS} + I_{SC} \quad (16)$$

The optional current $I_{SC}$ (as will be described in greater detail hereinafter) basically enables execution of an offset correction in the output signal $V_{int}$.

The current is according to Eq. (14) or Eq. (16) is then supplied at input to the amplification circuit 20, and the amplification circuit 20 is configured to generate an output signal representing the integral of the current is.

Hence, in general, on the basis of what has been described, the circuit architecture comprises a sensor circuit 10, which includes a first FET $M_{BLIND}$ and a second FET $M_{EXP}$, both preferably TMOS transistors, arranged in a differential pair that supplies to a respective first node 102 and a respective second node 104 a differential current is $=i_2-i_1$.

The differential pair is more specifically structured as follows; i.e., said sensor 10 comprises:

- a first FET $M_{BLIND}$ and a second FET $M_{EXP}$, both preferably TMOS transistors;
- a first node 102, a second node 104, and a third node 106, where a drain terminal of said first FET $M_{BLIND}$ is connected to the first node 102, a drain terminal of said second FET $M_{EXP}$ is connected to said second node 104, and the source terminals of said first and second FETs $M_{BLIND}$, $M_{EXP}$ are connected to said third node 106;
- a first bias-current generator 206, configured to generate a bias current $I_B$ at an output of the first bias-current generator 206, where the output of said first bias-current generator 206 is connected to said first node 102;
- a second bias-current generator 208, configured to generate a bias current $I_B$ at an output of said second bias-current generator 208, wherein the output of said second bias-current generator 208 is connected to said second node 104; and
- a third FET $M_B$, where a drain terminal of said third FET $M_B$ is connected to said third node 106, and a source terminal of said third FET $M_B$ is connected to a reference voltage.

In addition, in various embodiments, the sensor 10 may comprise, or be associated to, a circuit, which includes at least one current generator 50, 52, 54 configured to apply a correction current $I_{SC}$ to said first node 102 and/or to said second node 104;

Moreover, in various embodiments, the sensor 10 may comprise, or be associated to, a regulation circuit 204 configured to drive a gate terminal of said third FET $M_B$ in such a way as to regulate the common mode of the voltage at said first node 102 and of the voltage at said second node 104 on a required value $V_{CM1}$.

To enable correct measurement of the differential currents, the circuit 20 is comprised in a circuit architecture 70 of a differential-current reading circuit, which identifies a continuous-time sigma-delta converter.

The above, as compared to solutions of the prior art such as in United States Patent Application Publication No. 2020/0259474, enables an overall reduction of the blocks used. Furthermore, there is an advantage in terms of power consumption in so far as in this solution it is necessary to choose a clock signal with constraints that limit optimization of the power, and moreover a driving stage (or pre-amplification stage) between the continuous-time signal and the analog-to-digital converter is not necessary.

In fact, as illustrated more fully in what follows, the differential-current reading circuit 70, via adoption of a continuous-time sigma-delta converter architecture, integrates in this architecture both the amplification function, circuit 20, and the conversion function (designated by 30', and, as illustrated in what follows, obtained mainly via the quantizer of the sigma-delta converter to which a decimator circuit additionally contributes). The amplifier 202 of the circuit 20 with the corresponding feedback capacitors $C_1$ and $C_2$ is comprised, forming an integral part thereof, in an integrator-and-adder stage 201, which further comprises a digital-to-analog converter, or DAC, 203, the differential outputs of which are coupled to the differential inputs of the amplifier 202.

A continuous-time sigma-delta converter in general comprises a loop filtering block, the output of which is supplied to a multilevel quantizer, the output of which is fed back via a digital-to-analog converter and added to the input of the loop filtering block.

In the solution described in FIG. 2, the amplification circuit 20 identifies in itself a loop filtering function.

In the architecture proposed in FIG. 2, however, the output of the amplifier 202 is associated to an optional block 207, which represents an additional network for completion of the loop filtering function, already implemented by the circuit 20, which, as explained in what follows, forms part of a DAC 203 of a sigma-delta integrator 201. This block 207, as explained in what follows, according to the implementations, may not be present or else may comprise one or more other discrete-time or continuous-time sigma-delta integrators so as to implement higher-order filtering converters. Downstream of the aforesaid block 207, a sampling circuit 205 is comprised, including two switches $SW_{S1}$ and $SW_{S2}$ on the differential outputs of the integrator-and-adder stage 201 or of the block 207, which selectively couple to a multilevel quantizer 206 with M levels. These switches $SW_{S1}$ and $SW_{S2}$ are implemented by a sample signal Φ2 at a sample frequency $f_s$, which in particular samples the continuous-time output for the discrete-time stages downstream.

The above M-level quantizer 206 supplies its own quantized digital output, designated by MQ, which is also the output of the continuous-time sigma-delta converter 20, to a digital decimation filter 60, which is configured to filter and decimate in frequency the aforesaid output in order to obtain the final output signal OUT of the entire analog-to-digital conversion system 20. The digital decimation filter 60, if present, identifies with the M-level quantizer 206 the analog-to-digital converter 30'.

The output MQ of the M-level quantizer 206 is also supplied to the input of the digital-to-analog converter (DAC) 203, the reference frequency of which is supplied by a current generator 208, which supplies a reference current denoted as $I_{DAC}$. In this way, the signal at output from the quantizer 206 is fed back and subtracted at input to the amplifier 202, once it has been converted into an analog signal by the DAC 203, i.e., an analog feedback current IF.

It may be noted how sampling, at the sample frequency fs, is carried out within the feedback loop; to be precise, sampling is carried out in block 205 after filtering by the integrator-and-adder stage 201, and possibly downstream of the block 207, upstream of the multilevel quantizer 206.

In the sequel of the description, the choices of design to be adopted in the proposed solution will be presented, as regards the reference current of the DAC 203 $I_{DAC}$ in order to obtain an amplification independent of the technological process spread. The choices regarding the characteristics of the TMOS sensor at the bias current $I_B$ have already been illustrated previously.

As already mentioned, if the current $I_B$ is generated so as to be a PTAT (Proportional-To-Absolute Temperature) current, i.e., a current proportional to the temperature $$I_B = \frac{\Delta V_{BE}}{R_1} = \frac{V_T \cdot \ln(a)}{A \cdot R_{BIAS}} \quad (17)$$

wherein $A \cdot R_{BIAS}$ is the resistance of the bias resistor in the PTAT current generator for $I_B$, then, with reference to Eq. (16), the gain of the temperature $\Delta T_{TMOS}$ is independent of the operating temperature $$i_S = \frac{\ln(a)}{n \cdot A \cdot R_{BIAS}} \cdot \alpha_{VGS}(T_{amb}) \cdot \Delta T_{TMOS} + I_{SC} \quad (18)$$

The average value of the output of the continuous-time sigma-delta converter proposed in FIG. 2 may be expressed as the ratio between the signal current is and the reference current $I_{DAC}$ $$\text{avg(OUT)} = \frac{1}{I_{DAC}} \cdot \left( \frac{\ln(a)}{n \cdot A \cdot R_{BIAS}} \cdot \alpha_{VGS}(T_{amb}) \cdot \Delta T_{TMOS} + I_{SC} \right) \quad (19)$$

The solution described preferably requires the reference current $I_{DAC}$ to be generated of a bandgap type, and hence, for example, requires the generator 208 to be a generator of a bandgap type, i.e., independent of the temperature so that the gain of the temperature $\Delta T_{TMOS}$ is independent of the operating temperature. In fact, considering that $$I_{DAC} = \frac{V_{REF}}{R_2} = \frac{V_{REF}}{B \cdot R_{BIAS}} \quad (20)$$

the average value avg(OUT) of the output of the continuous-time sigma-delta converter of Eq. (9) can be expressed by the following formula:

$$\text{avg(OUT)} = \frac{B \cdot R_{BIAS}}{V_{REF}} \cdot \left( \frac{\ln(a)}{n \cdot A \cdot R_{BIAS}} \cdot \alpha_{VGS}(T_{amb}) \cdot \Delta T_{TMOS} + I_{SC} \right) \quad (21)$$

Wherein $B \cdot R_{BIAS}$ is the resistance of the bias resistor in the current generator (for example of the bandgap type) for $I_{DAC}$.

From Eq. (21) there emerges the usefulness of the optional current $I_{SC}$ in carrying out an offset correction in the output signal. The signal-correction block 50, together with the block that carries out common-mode control, i.e., 204, enables correction of possible leakages or undesired signals that send the block OTA, i.e., the amplifier 202 and/or the ADC block, outside the dynamics of proper operation or else could send the TMOS transistors away from the desired operating point. Hence the system proposed is robust also for compensating possible leakage-current signals injected into the high-impedance nodes "$V_{OIN}$" and "$V_{OINP}$": the common-mode component of these leakages is compensated by the module 204, thus preventing common-mode drifts, whereas the differential leakage component may be eliminated by carrying out tuning, i.e., trimming, of the value of the current $I_{SC}$ of the block 50 (considering that, as emerges from Eq. (6), $I_{SC}$ adds to the differential signal is).

The way in which the current $I_{SC}$ is generated defines the type of offset compensation that is carried out. For instance, considering the current $I_{SC}$ as a current of a bandgap type (i.e., that does not vary with temperature), also the correction of the offset that is obtained is independent of the temperature (first case, in the subsequent Eq. (12)), whereas, considering the current $I_{SC}$ as a PTAT current (i.e., proportional to temperature), also the correction of the offset will be proportional to the temperature (second case, in the Eq. (22) below)

$$\text{avg(OUT)} = \begin{cases} \frac{1}{V_{REF}} \cdot \left( \frac{\ln(a)}{n} \cdot \frac{B}{A} \cdot \alpha_{VGS}(T_{amb}) \cdot \Delta T_{TMOS} + \frac{B}{C} \cdot V_{REF} \right) \rightarrow \\ \quad \text{if } I_{SC} = \frac{V_{REF}}{C \cdot R_{BIAS}} \\ \frac{1}{V_{REF}} \cdot \left( \frac{\ln(a)}{n} \cdot \frac{B}{A} \cdot \alpha_{VGS}(T_{amb}) \cdot \Delta T_{TMOS} + \frac{B}{C} \cdot \ln(c) \cdot \frac{K}{q} \cdot T \right) \rightarrow \\ \quad \text{if } I_{SC} = \frac{\Delta V_{BE}}{C \cdot R_{BIAS}} = \frac{V_t \cdot \ln(c)}{C \cdot R_{BIAS}} = \frac{\ln(c)}{C \cdot R_{BIAS}} \cdot \frac{K}{q} \cdot T \end{cases}$$

Wherein $C \cdot R_{BIAS}$ is the resistance of the bias resistor in the current generators for $I_{SC}$.

The resistances "$A \cdot R_{BIAS}$", "$B \cdot R_{BIAS}$", and "$C \cdot R_{BIAS}$", introduced into Eqs. (17), (20), and (22) must be resistances of the same type and designed to be matched with one another in order to render the ratio B/A and the ratio B/C present in Eq. (22) very accurate. From Eq. (12) it may be noted how in the proposed solution the dependence of the output signal upon the technological process spread in the manufacture of the resistances has been eliminated; in fact, the term $R_{BIAS}$ in Eq. (12) has been cancelled out and is no longer present in the equation. This result has been obtained thanks to the architectural choice made and thanks to an appropriate choice of the bias currents. As a result, the generated output OUT is accurate and independent of process variations of the resistances for the current sources $I_B$ and $I_{DAC}$. In other words, a result of this is that dependence of the output signal on technology process (i.e., with resistance of the current generator resistors) is removed. In this way, the output signal is not affected by the technological process spread regarding resistances because the currents of both the current sources $I_B$ and $I_{DAC}$ are inversely proportional to the resistance $R_{BIAS}$.

Moreover, from Eq. (22) it may be concluded that in the first case ($I_{SC}$ of a bandgap type) a possible offset independent of the temperature can be corrected, whereas in the latter case ($I_{SC}$ of a PTAT type) a possible offset that varies in temperature can be corrected. In the case where it is desired to correct a contribution of offset that, in addition to a part that does not vary in temperature, also has a temperature-variable part, the offset must be corrected considering the sum of two current contributions, for example $I_{SC1}$ of a bandgap type and $I_{SC2}$ of a PTAT type, and both must then be adjusted to set to zero each of the two parts present in the offset, namely, the temperature-invariable part and the temperature-variable part, that are to be corrected.

Figure 3:
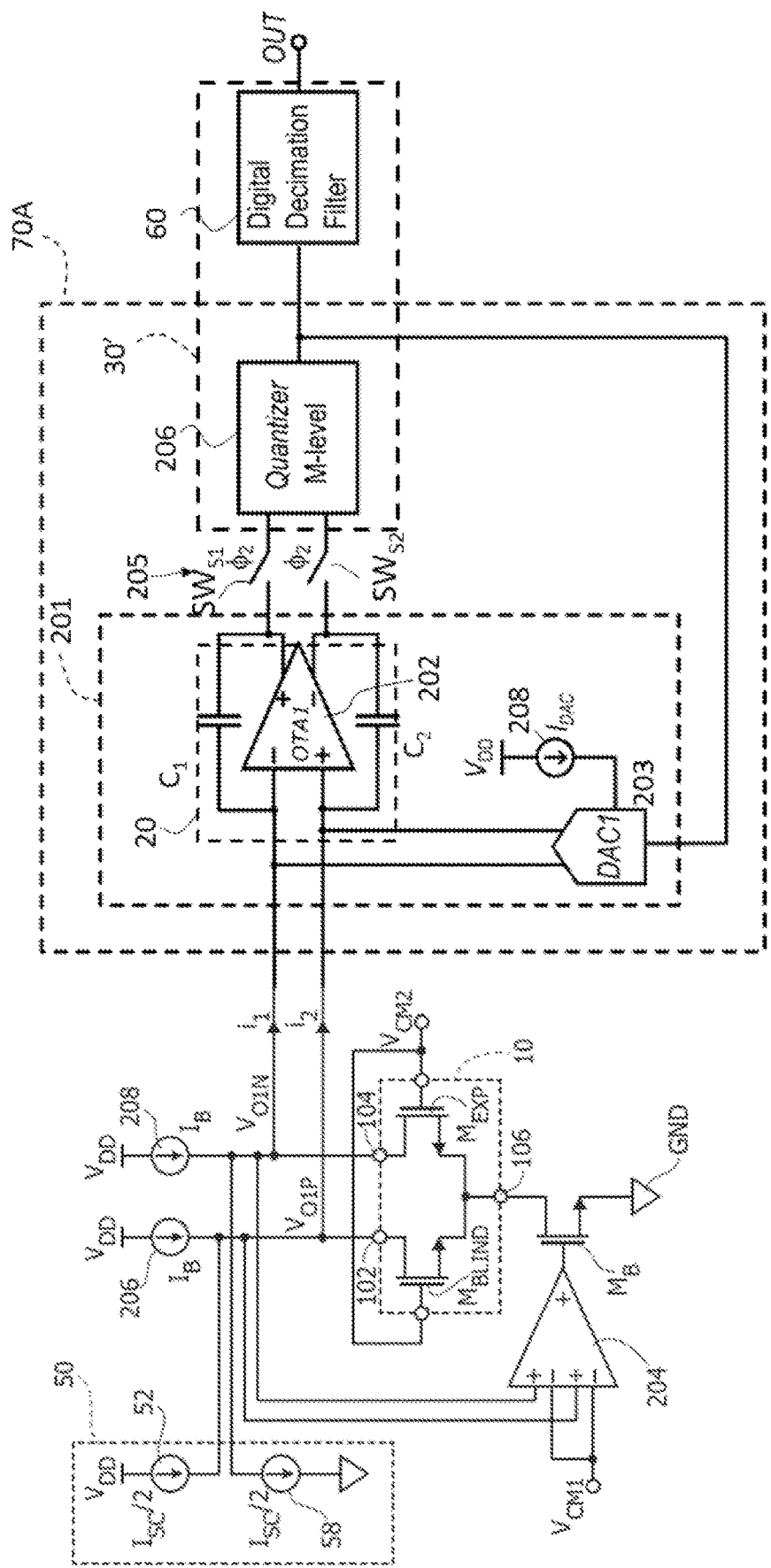
FIG. 3 shows a first embodiment of an amplification interface.

FIG. 3 shows a first implementation 70A of the scheme of amplification architecture of FIG. 2, i.e., the differential-current reading circuit, implemented in which is a first-order continuous-time sigma-delta converter, i.e., the optional block 207 that represents an additional network for completion the loop filtering function in FIG. 2 is absent.

Figure 4:
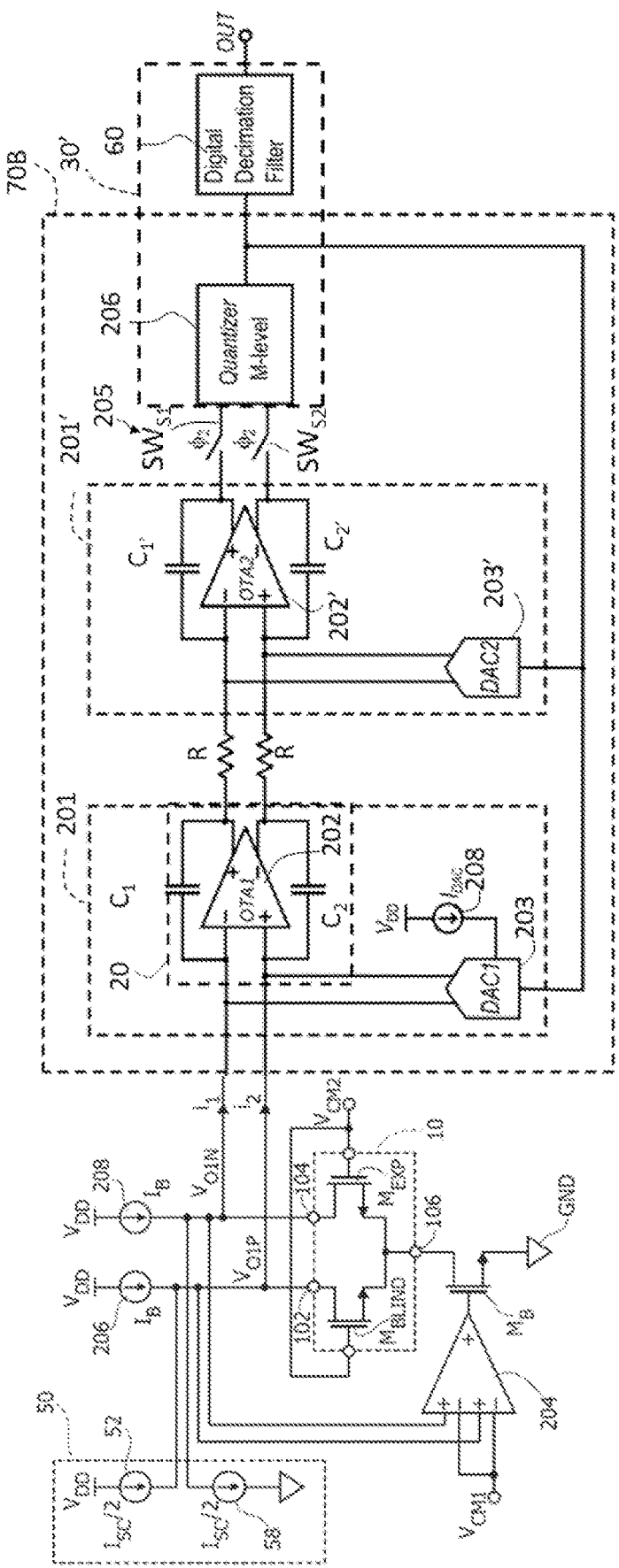
FIG. 4 shows a second embodiment of an amplification interface.

FIG. 4 shows a second implementation 70B of the scheme of amplification architecture of FIG. 2, i.e., the differential-current reading circuit, where the block 207 comprises, as additional network for completion the loop filtering function 207, a second integrator-and-adder stage 201', similar to that of FIG. 3, except for the converter 203, which does not receive the current $I_{DAC}$.

Figure 5:
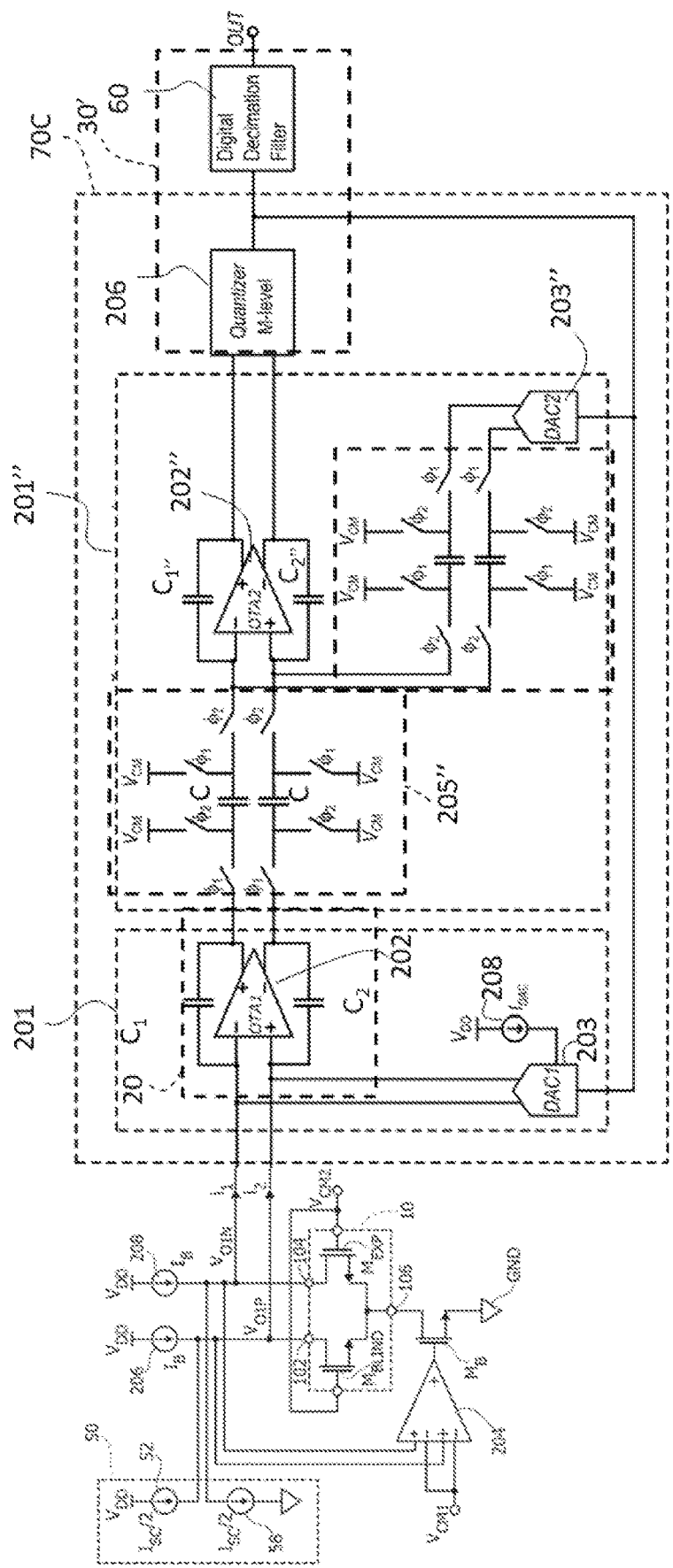
FIG. 5 shows a third embodiment of an amplification interface.

FIG. 5 shows a third implementation 70C of the scheme of amplification architecture of FIG. 2.

The two integrator-and-adder stages 201 and 201' as a whole determine a second-order continuous-time sigma-delta converter the output of which is supplied to the converter 30, i.e., to the quantizer 206.

From the theory of sigma-delta converters, it is known that by inserting into the loop higher-order filters, the converter filters the input signals at low frequencies to a greater extent. In other words, using more than one cascaded integrator-and-adder stage 201, i.e., with the output of one stage coupled to the input of the other, possibly separated by an insulation resistance R, within the loop, it is possible to obtain higher orders in shaping the quantization noise and hence it is possible to obtain better values of ENOB (Effective Number Of Bits) for a given value of oversampling ratio.

The above insulation resistances R convert a voltage signal into a current signal. In fact, the block 202 with the capacitances C1 and C2 (as likewise the block 202' with the capacitances C1' and C2') reads a current input. Since the output of the block 202 is a voltage output, the resistances R downstream convert the current signal so that it can be correctly read by the block downstream.

In the implementation of FIG. 4, the second integrator-and-adder stage 201' is provided with a continuous-time stage, whereas in the implementation of FIG. 5 the second integrator-and-adder stage, designated by 201", is obtained as a discrete-time stage. Also in this case the integrator comprises an operational amplifier 202" and a converter 203", which converts into analog the output of the quantizer 206; however, set between the output of the integrator-and-adder stage 201 and the input of the operational amplifier 202" is a track-and-hold block 205", obtained through switched-capacitor circuits set on each differential line, and a similar track-and-hold block 205" is set between the output of the DAC converter 203" and the input of the operational amplifier 202", which operates with the a.c. phases 1 and 2 at the frequency fs. These track-and-hold blocks 205" are necessary for holding the data during discrete-time operation.

The block 205" between the amplifier 202 and the amplifier 202" comprises input switches that operate on the differential lines at one of the phases $\Phi_1$ of the switched-capacitor circuit and output switches that operate at the other phase $\Phi_2$, which may, for example, be considered as corresponding to the phase $\Phi_2$ at the sample frequency fs of the block 205 of FIG. 2. The input switches couple to a terminal of a capacitor C for differential line, which is coupled, via a respective switch, to a voltage $V_{CM}$, which represents the common-mode output level of the second DAC converter 203" and also the common-mode input level of the second OTA 202" by a switch at the second phase $\Phi_2$, which corresponds to that of FIG. 2, whereas the other terminal of the capacitor C, coupled to the input of 202" via the output switches, is coupled, via a respective switch, to a voltage $V_{CM}$ by a switch operating at the first phase $\Phi_1$, which is the negated version of the second phase $\Phi2$.

It is thus possible to extend the loop filtering of FIG. 4 or FIG. 5, increasing the order of the sigma-delta converter up to a certain value "n", i.e., inserting "n" cascaded (continuous-time and/or discrete-time) integrator stages, i.e., a plurality of stages. According to the solution proposed, if the aim is to increase the order of the converter, the first stage must in any case be a continuous-time integrator, the reference current of the DAC of which (which in the first integrator makes the addition of the feedback signal) must be a current $I_{DAC}$ supplied by a generator 208 according to what has been described in Eq. (10): in this way, according to the implementation proposed, the factor of amplification and conversion of the signal of the TMOS sensor into the digital domain is not affected by the dependence upon the technological process.

As has been mentioned, the second stage does not have a current generator $I_{DAC}$; moreover, the converter 203 has an output current signal, whereas the output signal of the converter 203" is a voltage signal.

According to the solution proposed, it is also possible to insert paths of a feed-forward type in order to limit the variation in dynamics of one or more stages of the converter or else in order to obtain a different characteristic of filtering within the sigma-delta loop.

Hence, on the basis of what has been described with reference to FIG. 2, the solution regards an electronic amplification-interface circuit of a sensor circuit 10, as discussed with reference to FIG. 2, which comprises:

a differential-current reading circuit, for example 70, comprising a first input terminal connected to the second node 104 and a second input terminal connected to the first node 102, said differential current amplification circuit comprising at least one continuous-time sigma-delta conversion circuit, which includes at least one integrator-and-adder module 201, the output signal of which $V_{int}$ is coupled to the input of a multilevel-quantizer circuit 206, which supplies at output a multilevel quantized signal MQ, said first integrator-and-adder module (201) comprising:
a differential current-integrator circuit 20, or 202, C1, C2 configured to supply at output through two output terminals a voltage $V_{int}$ proportional to the integral of a difference between the current $i_2$ received at said second input terminal of said differential integrator circuit 202 and the current $i_1$ received at said first input terminal of said differential current integrator 20, a digital-to-analog converter 203 driven by a respective reference current $I_{DAC}$, which receives and converts into a differential analog feedback signal IF said multilevel quantized signal MQ, said integrator-and-adder module 201 being configured to add said differential analog feedback signal IF to said differential signal formed at said first and second input terminals of said integrator circuit 20.

In addition, in variant embodiments, the amplification-interface circuit comprises a plurality of integrator-and-adder modules 201, 201' set in series, the respective DACs of which 203, 203' receive said multilevel quantized signal MQ, the output of the last integrator-and-adder module 201' in said series being coupled to the input of said multilevel quantizer 206.

Moreover, in variant embodiments, the amplification-interface circuit may comprise, coupled between said module or plurality of modules and said multilevel quantizer 206, a sample circuit 205 comprising a first electronic switch $SW_{RST1}$ and a second electronic switch $SW_{RST2}$ coupled on said inputs of said quantizer 206 and driven by a sample signal at a given sample frequency $f_s$.

Furthermore, in variant embodiments, the amplification-interface circuit may comprise at least one discrete-time sigma-delta conversion circuit 201", coupled between said first module or plurality of modules and said multilevel quantizer, comprising a respective integrator circuit 202", C1", C2" and a respective digital-to-analog converter 203", which receives said multilevel quantized signal and converts into an analog feedback signal, which is added to the signal at the differential input of the respective integrator circuit $i_2$, $i_1$, and respective track-and-hold circuits, in particular switched-capacitor circuits, set between the output of said module 201 or plurality of modules 201, 201' and said differential input and set between the output of the digital-to-analog converter 203" and said differential input.

Consequently, in various embodiments, the solutions proposed enable amplification of the signal generated by TMOS transistors, without being affected by the technological process spread regarding the resistances and capacitances.

In various embodiments, this has been obtained thanks to the architectural solution proposed, in addition to an appropriate choice of the reference current $I_{DAC}$ within the sigma-delta loop converter. Added to this is the appropriate choice of the bias current $I_B$ for the sensor.

In various embodiments, the solution proposed enables correction of the offset and variation of the temperature offset.

The solution proposed, as compared to the prior art, presents the advantage of being more favourable in reducing power consumption and moreover, by increasing the order of the converter, it is possible to increase the ENOB (Effective Number Of Bits) of the system.

In general, the solution proposed has been devised to amplify the signal generated by TMOS transistors, but can also be used in the case where the transistors $M_{BLIND}$ and $M_{EXP}$ are two normal MOS transistors, or in general FETs, and a differential signal to be amplified is supplied to their input (i.e., to the gate terminals of the two transistors).

Advantageously, in the solution proposed, even though signals synchronous with a clock are necessary for operation of the sigma-delta converter, it is possible to choose the frequency to optimize reduction of current consumption.

The claims form an integral part of the technical teaching of the disclosure provided herein.

Of course, without prejudice to the principle of the invention, the details of construction and the embodiments may vary widely with respect to what has been described and illustrated herein purely by way of example, without thereby departing from the scope of the present invention, as defined by the ensuing claims.

The invention claimed is:

1. An amplification-interface circuit of a sensor circuit formed by a first field effect transistor (FET) and a second FET arranged in a differential pair to supply a differential current to a first node and a second node, comprising:
 a differential-current reading circuit including a first input terminal connected to said second node and a second input terminal connected to said first node, said differential-current reading circuit comprising a continuous-time sigma-delta conversion circuit including at least one integrator-and-adder module generating an output signal that is coupled to an input of a multilevel quantizer circuit configured to output a multilevel quantized signal;
 wherein said at least one integrator-and-adder module comprises:
  a differential current-integrator circuit configured to output a voltage proportional to an integral of a difference between currents received at said first and second input terminals; and
  a digital-to-analog converter, driven by a respective reference current generated by a reference current generator, configured to receive and convert said multilevel quantized signal into a differential analog feedback signal;
 wherein said differential current-integrator circuit is configured to add said differential analog feedback signal to said currents received at said first input terminal and said second input terminal.

2. The amplification-interface circuit according to claim 1:
 wherein said sensor circuit comprises: a first node, a second node, and a third node, where a drain terminal of said first FET is connected to said first node, a drain terminal of said second FET is connected to said second node, and source terminals of said first FET and of said second FET are connected to said third node; and
 further comprising a first bias-current generator configured to generate a bias current at an output of said first bias-current generator that is connected to said first node;
 a second bias-current generator configured to generate a bias current at an output of said second bias-current generator that is connected to said second node; and
 a third FET having a drain terminal connected to said third node and a source terminal connected to a reference voltage.

3. The amplification-interface circuit according to claim 2, further comprising at least one current generator configured to apply a correction current to one of said first node and said second node.

4. The amplification-interface circuit according to claim 2, further comprising a regulation circuit configured to drive a gate terminal of said third FET in such a way as to regulate a common mode voltage at said first node and at said second node to a required value.

5. The amplification-interface circuit according to claim 4, wherein said regulation circuit is configured to drive said gate terminal of said third FET in such a way that:

$$(VO1P+VO1N)/2=VCM1$$

where VO1P is the voltage at said first node, VO1N is the voltage at said second node, and VCM1 is said required value.

6. The amplification-interface circuit according to claim 2, wherein said first bias-current generator and said second bias-current generator are each current generators of a PTAT type.

7. The amplification-interface circuit according to claim 2, wherein the bias currents generated by the first and second bias-current generators and the respective reference current generated by the reference current generator are controlled so that an output of the differential-current reading circuit is independent of process variation of resistances in the first and second bias-current generators and the reference current generator.

8. The amplification-interface circuit according to claim 2, wherein the bias currents generated by the first and second bias-current generators are inversely proportional to resistances of the first and second bias-current generators so that an output of the differential-current reading circuit is independent of technological process spread regarding said resistances.

9. The amplification-interface circuit according to claim 1, wherein said differential current-integrator circuit comprises:
 a differential operational amplifier having a first input connected to said first input terminal and a second input connected to said second input terminal;
 a first capacitor connected between a first output of said differential operational amplifier and the first input; and
 a second capacitor connected between a second output of said differential operational amplifier and the second input.

10. The amplification-interface circuit according to claim 1, wherein the at least one integrator-and-adder module comprises a plurality of integrator-and-adder modules coupled in series, and wherein each digital-to-analog converter receives said multilevel quantized signal, and wherein an output of a last integrator-and-adder module in said series is coupled to the input of said multilevel quantizer circuit.

11. The amplification-interface circuit according to claim 1, further comprising, coupled between said at least one integrator-and-adder module and said multilevel quantizer circuit, a sampling circuit comprising a first electronic switch and a second electronic switch coupled on said inputs of said multilevel quantizer circuit and driven by a sampling signal at a given sampling frequency.

12. The amplification-interface circuit according to claim 1, further comprising at least one discrete-time sigma-delta conversion circuit coupled between said at least one integrator-and-adder module and said multilevel quantizer circuit and comprises a respective integrator circuit and a respective digital-to-analog converter which receives said multilevel quantized signal for conversion into an analog feedback signal that is added to the signal at the differential input of the respective integrator circuit, and respective track-and-hold circuits formed by switched-capacitor circuits which are set between the output of said at least one integrator-and-module and said differential input and set between the output of the digital-to-analog converter and said differential input.

13. The amplification-interface circuit according to claim 1, further comprising a decimator circuit coupled to the output of said multilevel quantizer circuit.

14. The amplification-interface circuit according to claim 1, wherein said first FET and said second FET are n-channel MOS transistors.

15. The amplification-interface circuit according to claim 14, wherein said first FET and said second FET are thermally isolated MOS (TMOS) transistors, and wherein the gate terminals of said first FET and said second FET are connected to a further reference voltage.

16. The amplification-interface circuit according to claim 1, wherein said respective reference current is generated by said reference current generator independent of temperature, in particular a generator of a bandgap type.

17. The amplification-interface circuit according to claim 1, wherein said first FET and said second FET are exposed to two different temperatures and the voltage at the two output terminals of said differential-current reading circuit is monitored.

18. A measurement system, comprising:
    an amplification-interface circuit according to claim 1; and
    a processing circuit connected to an output of said amplification-interface circuit.

19. The amplification-interface circuit according to claim 1, wherein an average value of the output signal is dependent on a ratio between the differential current and the respective reference current.

* * * * *